United States Patent  [10] Patent No.: US 6,897,405 B2
Cheng et al.  (45) Date of Patent: May 24, 2005

(54) METHOD OF LASER MILLING USING CONSTANT TOOL PATH ALGORITHM (75) Inventors: Chen-Hsiung Cheng, Chelmsford, MA (US); Xinbing Liu, Acton, MA (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/266,934

(22) Filed: Oct. 8, 2002

(65) Prior Publication Data
US 2003/0103107 A1 Jun. 5, 2003

Related U.S. Application Data (60) Provisional application No. 60/334,746, filed on Nov. 30, 2001.

(51) Int. Cl.[7] .............................................. B23K 26/02
(52) U.S. Cl. ................................................ 219/121.71
(58) Field of Search ....................... 219/121.72, 121.71, 219/121.67, 121.68, 121.69, 121.78, 121.79, 121.8; 700/159, 166, 161

(56) References Cited

U.S. PATENT DOCUMENTS 4,270,421 A    6/1981  Robinson et al.
4,298,784 A   11/1981  Schmall
4,718,418 A *  1/1988  L'Esperance, Jr. ............. 606/5
4,754,208 A    6/1988  Nakajima et al.
5,798,927 A *  8/1998  Cutler et al. ................. 700/188
6,231,566 B1 * 5/2001  Lai ............................... 606/5

FOREIGN PATENT DOCUMENTS

JP         1-254392     * 10/1989

OTHER PUBLICATIONS

PCT Notification of Transmittal of The International Search Report or the Declaration, dated Feb. 3, 2003, Applicant's File Reference 9432–158–POA, International Application No. PCT/US02/37962, 6 pages.

* cited by examiner

Primary Examiner—Jonathan Johnson
(74) Attorney, Agent, or Firm—Harness, Dickey & Pierce, PLC (57) ABSTRACT A method of creating a milled structure in a fixed material using a moving laser beam is disclosed, where a picosecond laser provides short pulses of light energy to produce required exposure steps, where a variable rate of laser beam movement conducts the milling upon the material, where the laser beam tool path directs the milling process to produce a milled hole of high quality and repeatability, and where the knowledge of how to measure these 3 quantities is returned as feedback into the laser system. The present invention is further embodied as a spiral milled tool path structured to achieve the customer specified tapered hole shape. The constant arc speed tool path is required to produce tapered holes to customer specification.

17 Claims, 6 Drawing Sheets

METHOD OF LASER MILLING USING CONSTANT TOOL PATH ALGORITHM

CROSS-REFERENCE TO RELATED APPLICATIONS

This application claims the benefit of U.S. Provisional Application No. 60/334,746, filed on Nov. 30, 2001. The disclosure of the above application is incorporated herein by reference.

FIELD OF THE INVENTION

The present invention generally relates to material ablation with pulsed light sources and particularly relates to laser drilling and laser milling.

BACKGROUND OF THE INVENTION

Material ablation by pulsed light sources has been studied since the invention of the laser. Reports in 1982 of polymers having been etched by ultraviolet (UV) excimer laser radiation stimulated widespread investigations of the process for micromachining. Since then, scientific and industrial research in this field has proliferated—mostly spurred by the remarkably small features that can be drilled, milled, and replicated through the use of lasers.

Ultrafast lasers generate intense laser pulses with durations from roughly $10^{-11}$ seconds (10 picoseconds) to $10^{-14}$ seconds (10 femtoseconds). Short pulse lasers generate intense laser pulses with durations from roughly $10^{-10}$ seconds (100 picoseconds) to $10^{-11}$ seconds (10 picoseconds). A wide variety of potential applications for ultrafast lasers in medicine, chemistry, and communications are being developed and implemented. These lasers are also a useful tool for milling or drilling holes in a wide range of materials. Hole sizes as small as a few microns, even sub-microns, can readily be drilled. High aspect ratio holes can be drilled in hard materials, such as cooling channels in turbine blades, nozzles in ink-jet printers, or via holes in printed circuit boards.

The ability to drill holes as small as microns in diameter is a basic requirement in many high-tech manufacturing industries. The combination of high resolution, accuracy, speed, and flexibility has allowed laser processing to gain acceptance in many industries, including the manufacture of integrated circuits, hard disks, printing devices, displays, interconnects, and telecommunication devices.

There exist multiple methods for laser machining; however, when fine features are to be drilled, tolerances are smaller for the finished product in laser micromachining. In this case, the process used must provide consistent, predictable, and repeatable results to satisfy the end application. Computer control via algorithms and software in laser micromachining provides the opportunity for fine control of hole geometry and the consistency required for a profitable, mass-production manufacturing facility. This opportunity should not be squandered, as many problems continue to exist related to micromachining.

One problem that persists in the field relates to avoiding manufacturing off-specification products with micromachining. This problem is persistent because, in micromachining, the tolerance for error is low and consistency is critical from product to product. For example, inkjet nozzle holes must be manufactured consistently to provide equal ink ejection from each hole when used. When a process is not consistent or repeatable, the manufacturing line produces off-specification products that result in wasted time and energy, mandatory rework, and reduced throughput. This in turn reduces profitability of a manufacturing facility. What is needed is a way to avoid manufacturing off-specification products with micromachining. Another persistent problem related to micromachining involves production of consistent, repeatable results in milling. As noted above, consistency and repeatability are important factors in producing technically acceptable, high quality micro-machined products. However, current methods of milling are not designed to ensure that the required hole geometry is consistent from item to item in the manufacturing line. What is needed is a way to produce consistent, repeatable results in milling.

Figure 1:
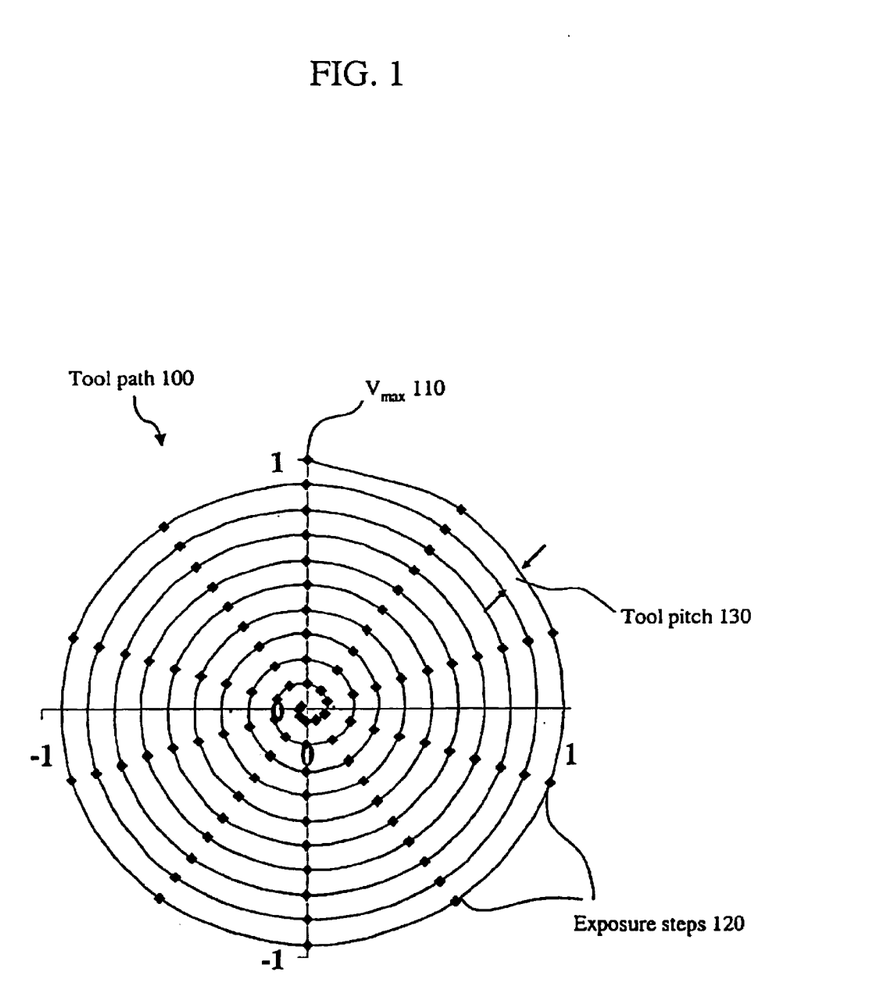
FIG. 1 is a block diagram of a constant angular velocity tool path.

A further persistent problem relating to micromachining involves providing guidelines for creating tool path geometry; in recent history, milling techniques that produce predictable and repeatable hole geometries have proven difficult to achieve. Trial and error methods have been used to manufacture desired hole geometries: parameters are iteratively changed to reach the desired shape. A typical procedure is to step through the desired tool path radius linearly over time; however, this technique introduces uneven pitches in the spiral path, which causes variations in the radial overlap. The uneven ablation that results is undesirable. An algorithmic approach proves mildly successful, in that a desired shape is produced using a constant angular velocity and tool pitch. However, this process does not compensate for the spacing of exposure steps generated near the center of the hole as shown in FIG. 1. What is needed is a way to provide guidelines for creating tool path geometry.

A still further persistent problem relating to micromachining involves providing a laser drilling system tool path allowing for constant material removal. Current requirements for milling require total material ablation across the workpiece target area. Past techniques include such methods as excimer laser ablation and a constant angular velocity approach, shown in FIG. 1. However, these techniques do not provide the flat surface required by customer specifications. What is needed is a way to provide a laser drilling system tool path allowing for constant material removal. A still further persistent problem relating to micromachining involves maintaining constant exposure of a laser source on a workpiece when the tool path is changing. In a constant pulse laser system, the laser is pulsed at a fixed repetition rate; therefore, the uniform ablation is translated into a required constant propagation speed of the laser strike point onto the workpiece. When using a semi-circular motion, such as spiraling, the linear speed of the strike point should be constant throughout the laser milling process to maintain constant ablation. What is needed is a way to maintain constant exposure of a laser source on a workpiece when the tool path is changing.

SUMMARY OF THE INVENTION

In a first aspect, the present invention is a method of creating a milled structure in a fixed material using a moving laser beam, where a picosecond laser provides short pulses of light energy to produce required exposure steps, where a variable rate of laser beam movement conducts the milling upon the material, where the laser beam tool path directs the milling process to produce a milled hole of high quality and repeatability, and where the knowledge of how to measure these 3 quantities is returned as feedback into the laser system.

In a second aspect, the present invention is a spiral milled tool path structured to achieve the customer specified tapered hole shape. The constant arc speed tool path is required to produce tapered holes to customer specification.

Further areas of applicability of the present invention will become apparent from the detailed description provided hereinafter. For example, while the present invention is described herein with reference to modifying angular speed as a function of radius for a spiral tool path that is round in shape, it should be understood that a constant arc speed can be obtained differently for different applications requiring a spiral that is not round in shape. Thus, a rate of traversal of the laser beam with respect to the surface of the workpiece is more generally modified as a function of distance from at least one fixed axis (for example, an oval has two relevant axes). It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

The present invention is a method of milling using a constant tool path algorithm (or alternatively, "milling algorithm") that can be used to produce holes in a consistent, repeatable process. Further, the process can be used to parallel-process a plurality of milled holes simultaneously.

As noted above, an algorithmic approach proves mildly successful, in that a desired shape is produced using a constant angular velocity and tool pitch. As also noted above, this process does not compensate for the spacing of exposure steps generated near the center of the hole.

Referring to FIG. 1, a constant angular velocity tool path (tool path) 100 includes an initial voltage at the outer contour ($V_{max}$) 110, a plurality of laser exposure steps 120, and the spacing of tool pitch 130. Using this approach, a large number of exposure steps 120 are generated near the target center, which result in excessive ablation in this area. In the present example, approximately 10,000 laser exposure steps 120 are used to create the spiraling shape of tool path 100.

Figure 2:
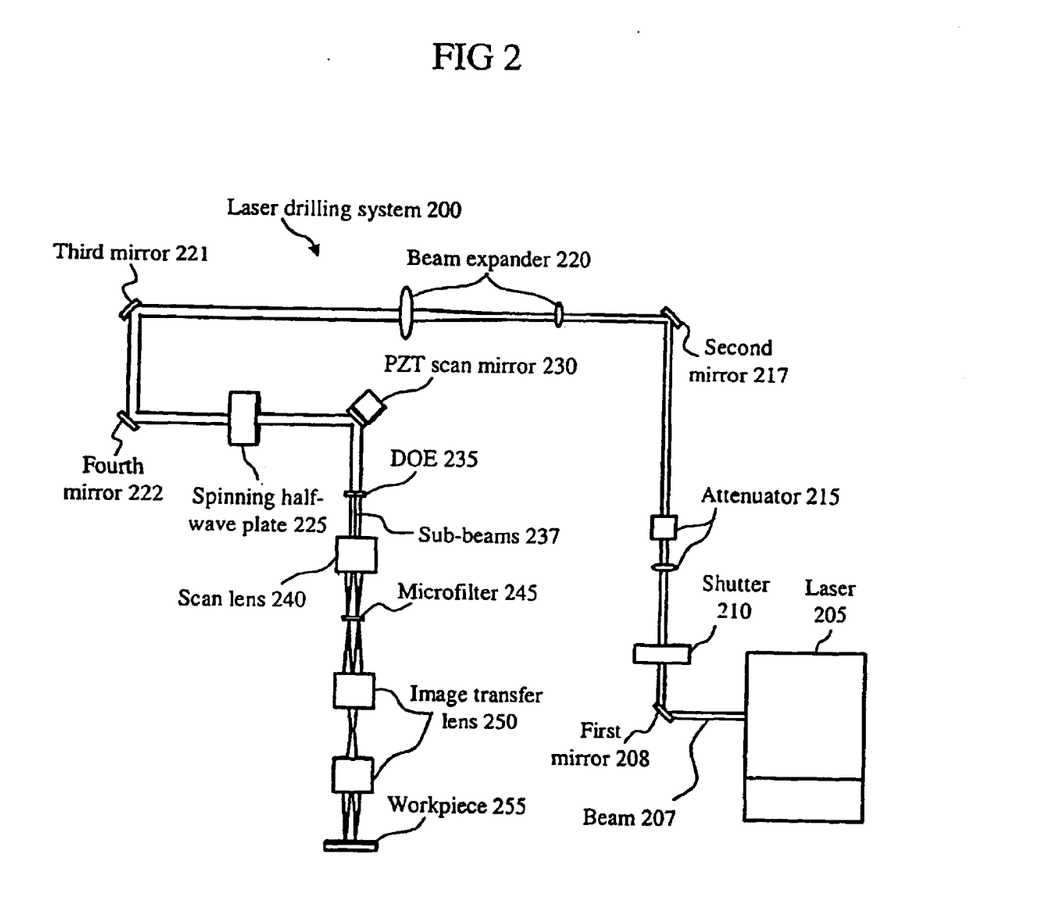
FIG. 2 is a block diagram depicting a simplified schematic of a laser drilling system.

Referring to FIG. 2, a simplified schematic of a laser drilling system 200, includes a laser 205, a beam 207, a shutter 210, an attenuator 215, a beam expander 220, a spinning half-wave plate 225, a first mirror 208, a second mirror 217, a third mirror 221, a fourth mirror 222, a piezo electric transducer (PZT) scan mirror 230, a diffractive optical element (DOE) 235, a plurality of sub-beams 237, a scan lens 240, a microfilter 245, an image transfer lens 250, and a workpiece 255, arranged as shown. Although the present invention uses a picosecond laser system, the present invention may be generalized for use with other laser systems, such as excimer, $CO_2$, and copper vapor laser systems.

A brief description of the elements and operation of laser drilling system 200 is provided below. In alternate embodiments, changes in the elements of laser drilling system 200 may be required. The present invention is not limited to the current selection and arrangement of elements in laser drilling system 200.

In operation, picosecond laser 205 emits beam 207 along the optical path identified in FIG. 2. Beam 207 propagates along the optical path, where it is incident upon first mirror 208. First mirror 208 redirects beam 207 along the optical path, where it is incident upon shutter 210. Shutter 210 opens and closes to selectively illuminate the work piece material. Beam 207 exits shutter 210 and propagates along the optical path to attenuator 215. Attenuator 215 filters the energy of picosecond laser 205 in order to precisely control ablation parameters Beam 207 exits attenuator 215 and propagates along the optical path, where it is incident upon second mirror 217. Second mirror 217 redirects beam 207 along the optical path, where it is incident upon beam expander 220.

Beam expander 220 increases the size of beam 207 to serve two purposes. First, it increases the beam size for the correct functioning of the DOE 235 as beam splitter. For the DOE 235 to function correctly, the beam size incident upon DOE 235 needs to be big enough to cover several periods of DOE 235. Second, it increases the beam size to match the scan lens pupil size. Beam 207 exits beam expander 220 and propagates along the optical path, where it is incident upon third mirror 221. Third mirror 221 redirects beam 207 along the optical path, where it is incident upon fourth mirror 222. Fourth mirror 222 redirects beam 207 along the optical path, where it is incident upon spinning half-wave plate 225. Spinning half-wave plate 225 changes the polarization of beam 207. Upon exiting spinning half-wave plate 225, beam 207 propagates along the optical path, where it is incident upon PZT scan mirror 230. PZT scan mirror 230 moves in a pre-defined pattern using a milling algorithm (not shown) to drill the holes in workpiece 255. PZT scan mirror 230 redirects beam 207 along the optical path, where it is incident upon DOE 235.

DOE 235 splits beam 207 into a plurality of sub-beams 237, which allow parallel drilling of workpiece 255. Sub-beams 237 exit DOE 235 and propagate along the optical path, where they are incident upon scan lens 240. Scan lens 240 determines the spot size of sub-beams 237 upon workpiece 255. Sub-beams 237 exit scan lens 240 and propagate along the optical path, where they are incident upon microfilter 245. Microfilter 245 equalizes the intensities of sub-beams 237. Sub-beams 237 exit microfilter 245 and propagate along the optical path, where they are incident upon image transfer lens 250. Image transfer lens 250 re-images the focal spots of sub-beams 237 onto workpiece 255. Sub-beams 237 ablate workpiece 255 in a pattern according to the pre-defined milling algorithm.

Figure 3A:
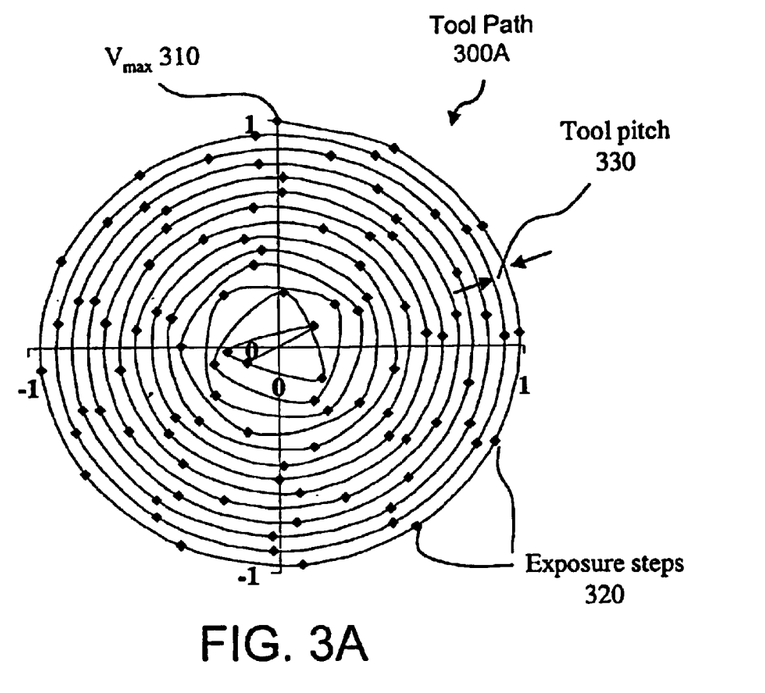
FIG. 3A is a block diagram of constant arc speed tool path corresponding to a round, inward spiral.

Referring to FIG. 3A, a constant arc speed tool path 300A and includes an initial outer contour exposure voltage ($V_{max}$)

310, a plurality of exposure steps 320 having constant arc speed and spacing, and the spacing of tool pitch 330. In operation, the desired tool path 300A, in the present example, consists of many revolutions separated by a tool pitch 330, which can be constant or variable depending on the desired final shape. Utilizing this constant arc speed tool path provides a way to avoid manufacturing off-specification products and a way to produce repeatable results in milling. $V_{max}$ 310 determines the outer radius of the spiral in tool path 300A. Each revolution, as shown, has many discrete exposure steps 320, which are specified by the software algorithm described in step 430 of method 400 below. In reference to FIGS. 2 and 3, as laser 205 pulses at a fixed repetition rate, the uniform ablation is translated into a constant propagation speed of PZT scan mirror 230 to direct the laser strike point onto exposure steps 320 of workpiece 255.

The constant arc speed tool path depicted in FIG. 3A provides for a flat surface in workpiece 255 being ablated. Maintaining this flat surface in workpiece 255 provides a laser drilling system tool path allowing for constant material removal. This constant arc speed tool path also provides a way to provide a laser drilling system tool path allowing for constant material removal.

Figure 3B:
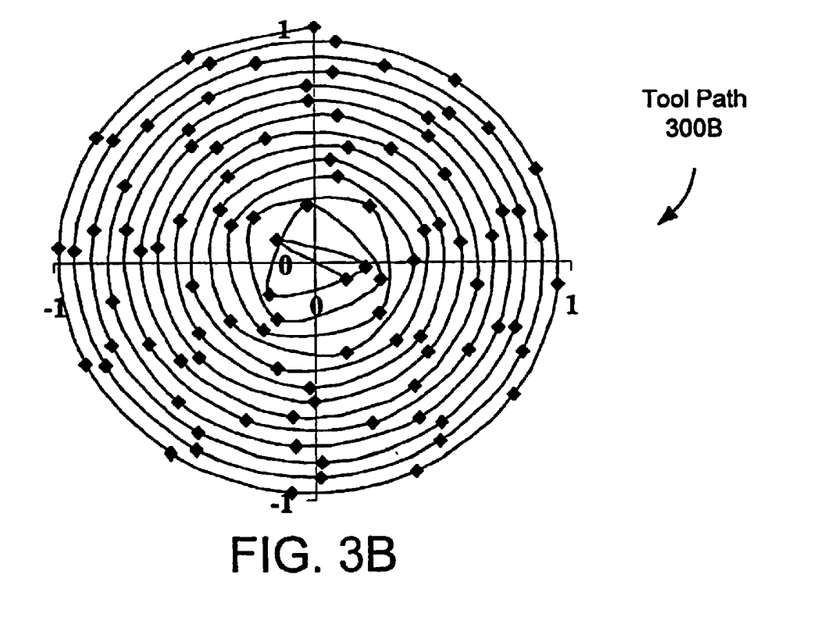
FIG. 3B is a block diagram of a constant arc speed tool path corresponding to a round, outward spiral.

During the manufacturing process employing the present invention, milling is also performed outward as the second half of the milling process. When the laser milling reaches the end of the inward spiral at t=T, the laser strike point is directed moving in an outward spiral tool path 300B as shown in FIG. 3B. After the laser strike point reaches the maximum radius for the next layer of milling at t=T', the next inward spiral begins.

Figure 4:
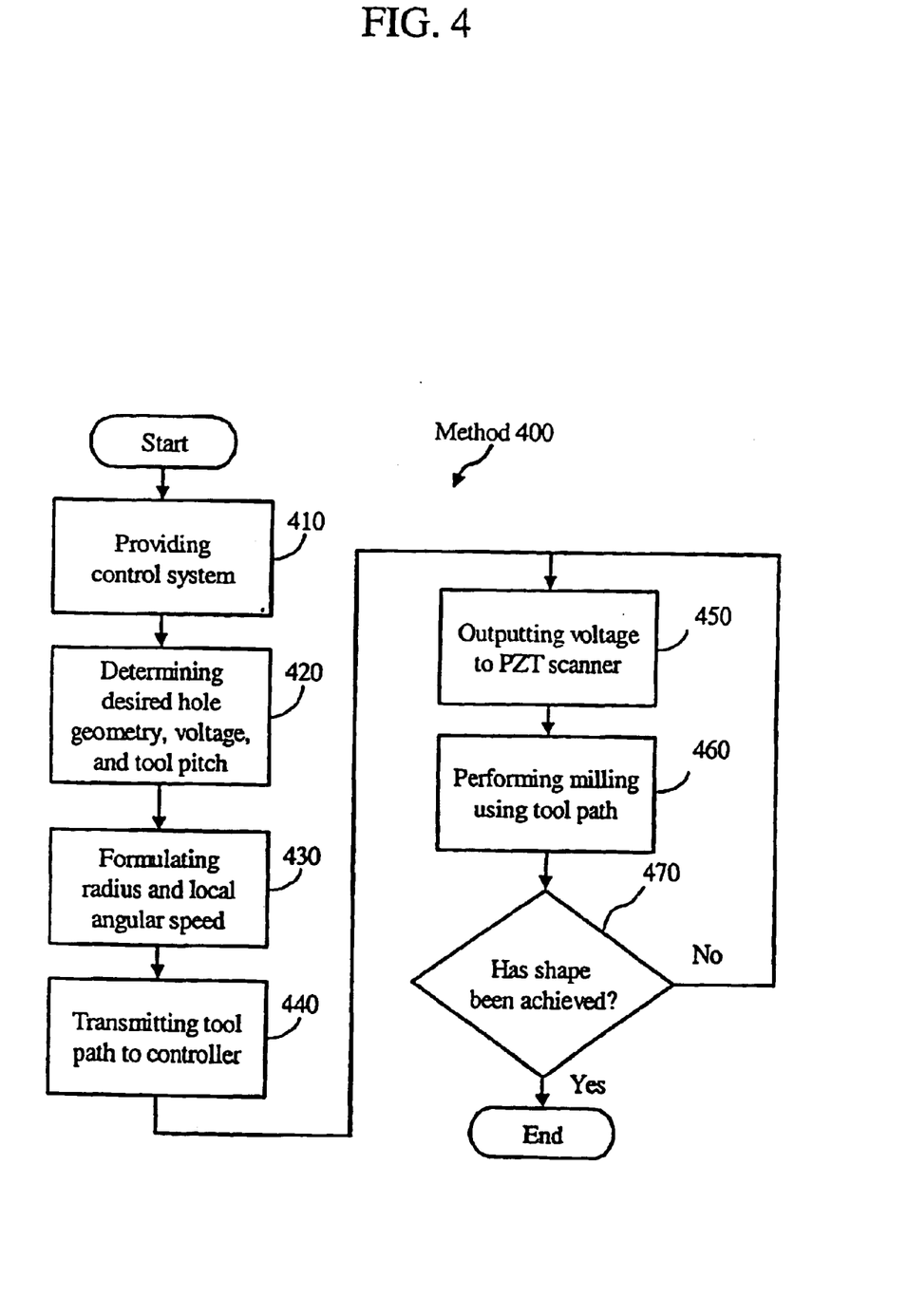
FIG. 4 is a flowchart diagram depicting a method of laser milling.

Referring to FIG. 4, a method 400 of laser milling includes several steps. At step 410, an operator or technician provides a control system (not shown), such as a computer, that is capable of running an algorithm via a software program. The control system is electronically connected to PZT scan mirror 230 to provide operational control signals for implementation of the algorithm. At step 420, the operator or technician uses customer-specified information, such as CAD files, and technical notes to determine the desired hole geometry, including taper angle, exit hole diameter, and entrance hole diameter. The operator or technician determines the voltage, $V_{max}$ 310, by considering entrance hole diameter, laser spot size, and voltage response of PZT scan mirror 230. The operator or technician also uses the spot size of laser 205 to determine the minimum allowable tool pitch 330 of tool path 300A. For example, if the spot size is 10 microns, tool pitch 330 should be a maximum of 10 microns to prevent under-ablated ridges from forming along outer walls of the radial contours. A pitch size around two microns works well with the 10-micron laser spot. A typical 40-volt of bias on the PZT scan mirror 130 deflects beam 107 by about 45 microns on workpiece 255. At step 430, the operator or technician launches software code (not shown), which resides in the control system identified in step 410 above to calculate the radius and angular speed over the period of laser drilling, T, to manufacture the desired hole geometry. For example, the following formula, Formula (A), describes the radius "r" along tool path 300A at any given time "t" during the laser drilling:

$$r(t) = \sqrt{r_0^2 - \left(\frac{r_0^2 - r_{min}^2}{T}\right)t} \quad (A)$$

Similarly, the following formula, Formula (B), describes the angular velocity "ω" along tool path 300A at any given time "t" during the laser drilling to achieve constant arc speed:

$$\omega(t) = \omega_0 \frac{r_0}{r(t)} \quad (B)$$

Also, when the laser milling reaches the end of the inward spiral tool path 300A at t=T, the laser strike point is directed moving in an outward spiral tool path 300B determined by the following equations during T≦t≦T'. Formula (C), describes the radius "r" along tool path 300A at any given time "t" during the laser drilling:

$$r'(t) = \sqrt{2r_{min}^2 - r_0^2 + \left(\frac{r_0^2 - r_{min}^2}{T}\right)t} \quad (C)$$

Similarly, the following formula, Formula (D), describes the angular velocity "ω" along tool path 300B at any given time "t" during the laser drilling to achieve constant arc speed:

$$\omega'(t) = \omega_0 \frac{r_0}{r'(t)} \quad (D)$$

These four formulas are used to formulate the tool paths for drilling conical shapes, which resides in algorithmic form in the software on the control system. This step provides guidelines to create tool path geometry.

At step 440, the control system transmits the results of the algorithm executed in step 430 to a tool path controller (not shown), such as a microprocessor, to initiate execution of the tool path and commence laser drilling. At step 450, the controller identified in step 440 transmits voltages to PZT scan mirror 230 over time that correspond to the digital output of the algorithm executed in step 430. The voltages are applied to PZT scan mirror 230 to translate its position in accordance with the calculated tool path and desired hole geometry in workpiece 255. At step 460, laser drilling system 200 mills workpiece 255 per the tool path algorithm, in a pattern illustrated in FIG. 3 above. In the present invention, laser milling is performed using a layer-by-layer spiraling algorithm ("tool path"), thus, forming a tapered hole by decreasing $V_{max}$ 310 for successive spirals.

As previously discussed, the present invention is not limited to the spiral shape; in alternate embodiments, other tool path algorithms keeping uniform exposure for varied shapes can be used. Also, $V_{max}$ can be decreased in various ways between successive layers to achieve a desired contour in a finished workpiece. The vertical cross section containing the axis of the hole determines how the $V_{max}(i)$ is progressed where i is the number of steps for reducing the $V_{max}$. A linear function of $V_{max}(i+1)=V_{max}(i)-\Delta V_{max}$ results in a constant taper with fixed taper angle. Another function of $V_{max}(i+1)=V_{max(i)}-(\Delta V_{max}*i)$ makes the taper angle less and less steep as radius is reduced. On the other hand, $V_{max}(i+1)=V_{max}(i)-(\Delta V_{max}/i)$ makes the taper angle progressively steeper. In general, the Vmax(i) needs to be determined by the cross section (or shape) specification.

At step 470, the tool path algorithm identified in step 430 determines whether the desired hole geometry has been achieved. The hole geometry has been achieved when the tool path algorithm has completed the pre-calculated number of necessary spiral ablations. Conventional measuring techniques such as use of confocal microscopy and optical profilometry can also be used to determine if the desired hole geometry has been reached. If yes, method 400 ends; if no, method 400 returns to step 450.

A nozzle plate of an ink-jet head may be constructed with the laser drilling system of the present invention as further detailed below.

Figure 5:
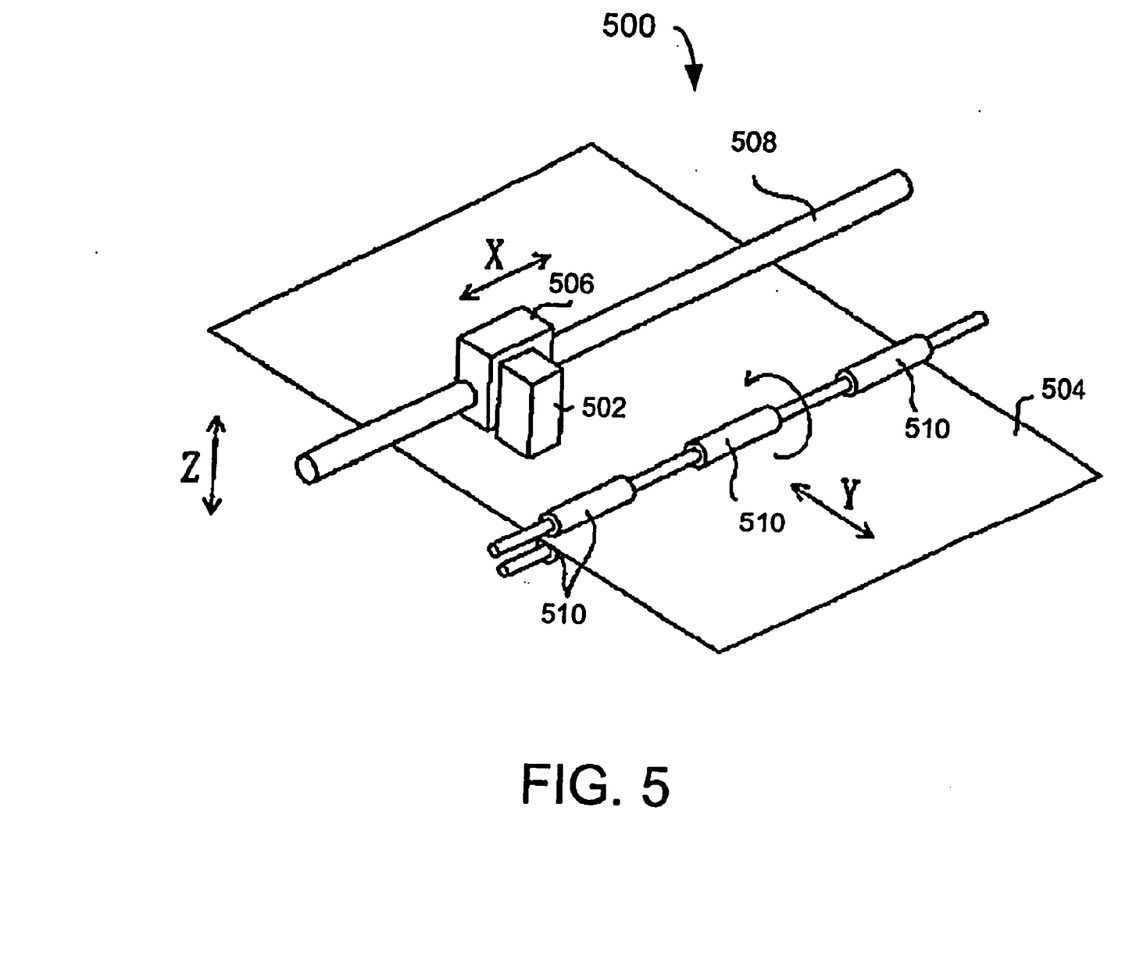
FIG. 5 is a perspective view showing major constituent components of an ink-jet printer.

As shown in FIG. 5, an ink-jet printer 500 has an ink-jet head 502 capable of recording on a recording medium 504 via a pressure generator. Ink droplets emitted from the ink-jet head 502 are deposited on the recording medium 504, such as a sheet of copy paper, so that recording can be performed on the recording medium 504. The ink-jet head 502 is mounted on a carriage 506 capable of reciprocating movement along a carriage shaft 508. More specifically, the ink-jet head 502 is structured such that it can reciprocate in a primary scanning direction X in parallel with the carriage shaft 508. The recording medium 504 is timely conveyed by rollers 510 in a secondary scanning direction Y. The ink-jet head 502 and the recording medium 504 are relatively moved by the rollers 510.

Figure 6:
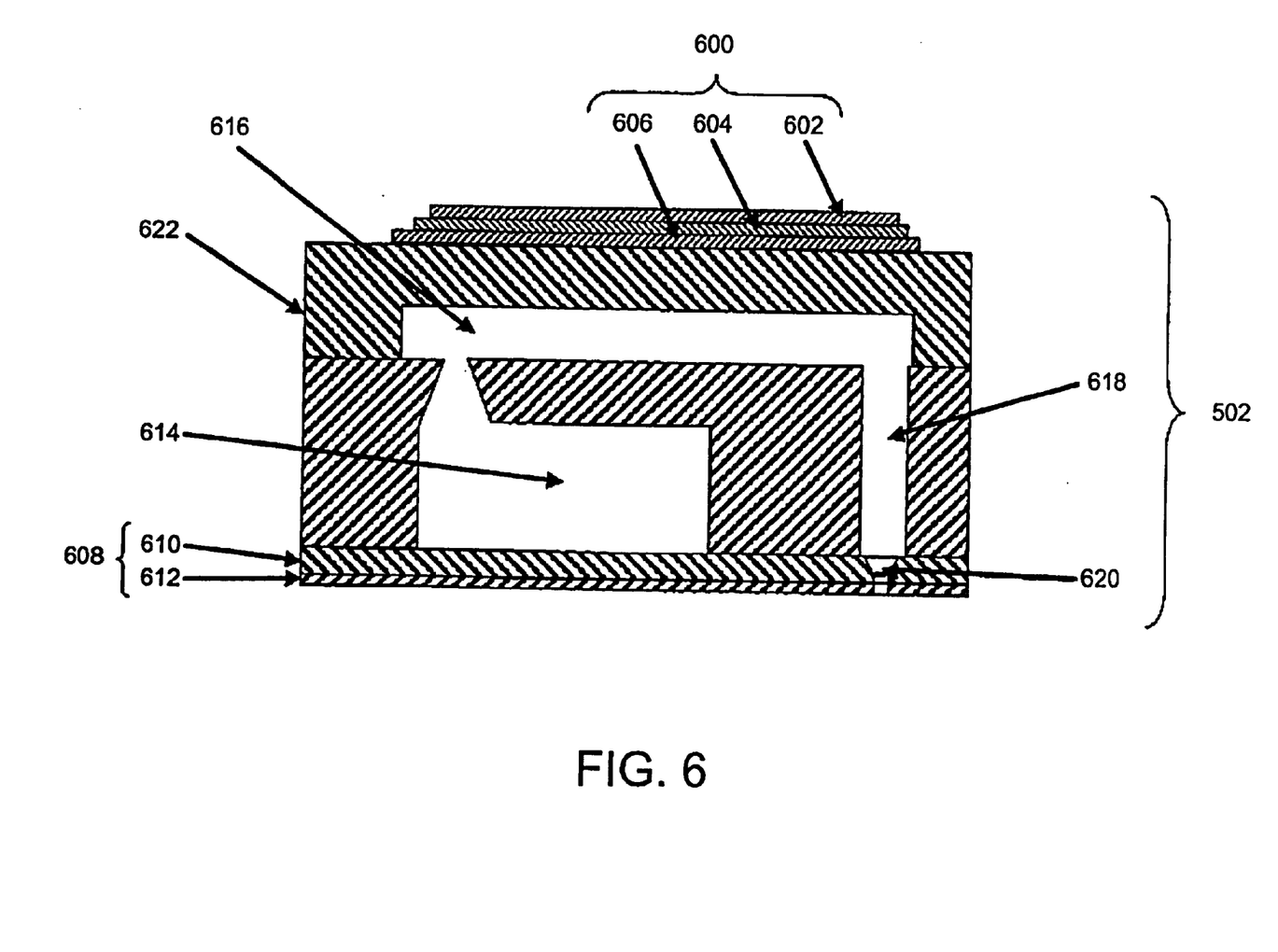
FIG. 6 is a schematic cross-sectional view of an ink-jet head.

Referring to FIG. 6, a pressure generator 600 is preferably a piezoelectric system, a thermal system, and/or equivalent system. In this embodiment, the pressure generator 600 corresponds to a piezoelectric system which comprises an upper electrode 602, a piezoelectric element 604, and an under electrode 606. A nozzle plate 608 comprises a nozzle substrate 610 and a water repellent layer 612. The nozzle substrate 610 is made of metal, resin, and/or equivalent material. The water repellant layer 612 is made, for example, of fluororesin or silicone resin. In this embodiment, the nozzle substrate 610 is made of stainless steel and has a thickness of 50 um, and the water repellent layer 612 is made of a fluororesin and has a thickness of 0.1 um. The ink-jet ink is filled in an ink supplying passage 614, a pressure chamber 616, an ink passage 618, and a nozzle 620. Ink droplets are ejected from the nozzle 620 as the pressure generator 600 pushes the pressure chamber element 620.

As a result of the present invention, very good nozzles are formed without flash and foreign matter (carbon etc) in the nozzle plate. Further, the accuracy of the nozzle outlet diameter is 20 um±1.5 um.

The present invention has several advantages. A first advantage of the present invention is that it avoids manufacturing off-specification products with micromachining. A second advantage of the present invention is that it provides a way to produce consistent, repeatable results in milling. A third advantage of the present invention is that it provides a system and guidelines for creating tool path geometry. A fourth advantage of the present invention is that it maintains constant exposure of a laser source on a workpiece without active laser power control. A fifth advantage of the present invention is that it provides constant material removal. A sixth advantage of the present invention is that the spiraling milling effect provides a continuous, consistent, and seamless laser ablation of a workpiece. A seventh advantage of the present invention is that the spiraling milling provides a way to machine micro features with cylindrical symmetry using laser ablation. An eighth advantage of the present invention is that it provides uniform material removal with predictable ablation rate so that an arbitrary profile may be established.

The present invention also has some disadvantages. One disadvantage of the present invention is that it is time intensive. However, any milling operation will require a similar amount of time to perform and thus is not a significant concern. A second disadvantage of the present invention is that it provides an increase in operational speed at the expense of control. However, the alternative closed loop system that provides additional control is too slow for cost effective mass manufacturing environment.

Another way to solve the same problem is to fire the laser at a faster rate when the hole radius is at the outer exposure steps. However, this approach requires additional process control that is difficult to synchronize and manage in the laser system.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method of performing laser milling comprising:
   determining a tool path for ablating a layer of material from an exposed surface of a workpiece with a laser; and
   ablating a layer of material from an exposed surface of the workpiece with a laser according to the tool path,
   wherein the tool path describes a substantially constant arc speed achieving a continuous spiral by application of the laser according to a non-uniformly changing radius and angular progression during the spiral.

2. The method of claim 1 further comprising communicating the tool path to a control system operable to affect a traversal of the exposed surface of the workpiece with the laser according to the tool path.

3. The method of claim 2, wherein said determining a tool path corresponds to formulating a radius and a local angular velocity.

4. The method of claim 3, wherein the radius is controlled as a function of voltage output to a PZT scan mirror of a laser system operated by the control system, and wherein said determining a tool path comprises determining an initial voltage.

5. The method of claim 4, wherein the radius is variable according to a tool pitch that corresponds to a change in voltage, and wherein said determining a tool path comprises determining a tool pitch based on a spot size of the laser system.

6. The method of claim 3, wherein the control system is operable to continuously modify the angular speed as a function of a continuously changing radius, thereby accomplishing the continuously constant arc speed.

7. The method of claim 3 further comprising modifying the tool path to accomplish removal of successive layers of material from a newly exposed surface of the workpiece, wherein the successive layers of material respectively decrease in area, thereby affecting desired contour in the laser milled workpiece.

8. The method of claim 7, wherein said modifying corresponds to decreasing the radius and increasing the local angular speed.

9. The method of claim 1 further comprising simultaneously performing ablation of multiple workpieces according to the tool path, wherein ablated regions of each workpiece is composed of substantially identical material and has substantially identical geometric characteristics.

10. The method of claim 1 further comprising simultaneously performing ablations of multiple regions of a workpiece according to the tool path, wherein each of said multiple regions is composed of substantially identical material and has substantially identical geometric characteristics.

11. The method of claim 6, wherein the radius is computed during an inward spiral according to:

$$r(t) = \sqrt{r_0^2 - \left(\frac{r_0^2 - r_{\min}^2}{T}\right)t},$$

and the angular velocity is computed during the inward spiral according to:

$$\omega(t) = \omega_0 \frac{r_0}{r(t)}.$$

12. The method of claim 11, wherein the radius is computed during an outward spiral according to:

$$r'(t) = \sqrt{2r_{\min}^2 - r_0^2 + \left(\frac{r_0^2 - r_{\min}^2}{T}\right)t},$$

and the angular velocity is computed during the outward spiral according to:

$$\omega'(t) = \omega_0 \frac{r_0}{r'(t)}.$$

13. The method of claim 5, further comprising determining a maximum tool pitch to be less than fifty percent of average spot size.

14. The method of claim 13, further comprising determining the maximum tool pitch to be more than forty percent of average spot size.

15. The method of claim 14, further comprising determining the maximum tool pitch to be no more than thirty percent of average spot size.

16. The method of claim 15, further comprising determining the maximum tool pitch to be more than twenty percent of average spot size.

17. The method of claim 1, further comprising applying an ultrafast laser at a constant rate of fire throughout the spiral.

* * * * *